United States Patent
Li et al.

(10) Patent No.: US 12,211,693 B2
(45) Date of Patent: Jan. 28, 2025

(54) SPACER PATTERNING PROCESS WITH FLAT TOP PROFILE

(71) Applicant: Applied Materials, Inc., Santa Clara, CA (US)

(72) Inventors: Chao Li, Santa Clara, CA (US); Gene Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 312 days.

(21) Appl. No.: 17/712,955

(22) Filed: Apr. 4, 2022

(65) Prior Publication Data

US 2022/0359201 A1  Nov. 10, 2022

Related U.S. Application Data

(60) Provisional application No. 63/185,335, filed on May 6, 2021.

(51) Int. Cl.
*H01L 21/033* (2006.01)
*H01L 21/311* (2006.01)

(52) U.S. Cl.
CPC .... *H01L 21/0337* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 9,640,409 | B1 * | 5/2017 | Yang | H01L 21/0337 |
| 2010/0173496 | A1 * | 7/2010 | Zhong | H01L 21/02326 |
| | | | | 438/770 |
| 2016/0027655 | A1 * | 1/2016 | Chen | H01L 21/28132 |
| | | | | 118/704 |
| 2016/0225640 | A1 | 8/2016 | Raley et al. | |
| 2017/0316940 | A1 * | 11/2017 | Ishikawa | H01L 21/0234 |
| 2018/0090335 | A1 * | 3/2018 | Karve | H01L 21/3086 |
| 2018/0226262 | A1 * | 8/2018 | Karve | H01L 21/0337 |
| 2019/0295906 | A1 * | 9/2019 | Clark | H01L 21/67196 |
| 2021/0066047 | A1 * | 3/2021 | Sung | H01L 21/31116 |
| 2021/0175080 | A1 * | 6/2021 | Jisong | H01L 21/3081 |
| 2021/0175090 | A1 * | 6/2021 | Takino | H01L 21/0337 |
| 2022/0102219 | A1 * | 3/2022 | Hsiung | H01L 29/66439 |

FOREIGN PATENT DOCUMENTS

| | | |
|---|---|---|
| CN | 103839783 A | 6/2014 |
| CN | 104022022 A | 9/2014 |
| KR | 20090049524 A | 5/2009 |

OTHER PUBLICATIONS

International Search Report and Written Opinion dated Aug. 2, 2022 for Application No. PCT/US2022/023294.

* cited by examiner

*Primary Examiner* — Allan W. Olsen
(74) *Attorney, Agent, or Firm* — Patterson + Sheridan, LLP

(57) ABSTRACT

A method for forming a metal containing feature includes performing a deposition process, the deposition process comprising conformally depositing an over layer on top surfaces of a patterned mandrel layer and over a spacer layer on sidewalls of the patterned mandrel layer, and performing an etch process, the etch process comprising removing the over layer from the top surfaces of the patterned mandrel layer and shoulder portions of the spacer layer, and removing the shoulder portions of the spacer layer, using a fluorine containing etching gas.

20 Claims, 4 Drawing Sheets

SPACER PATTERNING PROCESS WITH FLAT TOP PROFILE

CROSS-REFERENCE TO RELATED APPLICATIONS

This application claims benefit of U.S. provisional patent application Ser. No. 63/185,335, filed May 6, 2021, which is herein incorporated by reference.

BACKGROUND

Field

Examples of the present disclosure generally relate to methods for forming semiconductor structures. Particularly, embodiments of the present disclosure provide methods for patterning a spacer layer to be used in self-aligned multi-patterning (SAMP) processes.

Description of the Related Art

Self-aligned lithographic process techniques play an important role in advanced technology nodes. For dense metal layers at the 5-nm node and below, self-aligned multi-patterning (SAMP) processes, such as the self-aligned double patterning (SADP), the self-aligned quadruple patterning (SAQP), and the self-aligned litho-etch-litho-etch (SALELE) processes, have been utilized.

Generally, in such SAMP processes, a spacer layer is deposited over a pre-determined feature (often referred to as a mandrel) and subsequently etched back such that spacer portions on the sidewalls of the mandrel remain. Then, the mandrel may be etched away, leaving two spacers, for each edge of the mandrel. However, this conventional spacer patterning process often results in asymmetric profiles in the patterned spacers. For example, a patterned spacer may have a round shoulder portion at the top. Inconsistencies and asymmetries in the patterned spacer may affect pattern transfer, which may result in poor uniformity and pitch walk (i.e., variation in pitch) at downstream processes.

Therefore, there is a need for a method for patterning a spacer having a desired top profile, such as a flat top profile.

SUMMARY

Embodiments of the present disclosure provide a method for forming a metal containing feature. The method includes performing a deposition process, the deposition process comprising conformally depositing an over layer on top surfaces of a patterned mandrel layer and over a spacer layer on sidewalls of the patterned mandrel layer, and performing an etch process, the etch process comprising removing the over layer from the top surfaces of the patterned mandrel layer and shoulder portions of the spacer layer, and removing the shoulder portions of the spacer layer, using a fluorine containing etching gas.

Embodiments of the present disclosure also provide a method for forming a metal containing feature. The method includes performing a main etch process, the main etch process comprising removing portions of a spacer layer from top surfaces of a patterned mandrel layer, leaving only portions of the spacer layer on sidewalls of the patterned mandrel layer, using a first fluorine containing etching gas, performing a deposition process, the deposition process comprising conformally depositing an over layer on the top surfaces of the patterned mandrel layer and over the spacer layer on the sidewalls of the patterned mandrel layer, and performing an over etch process, the over etch process comprising removing the over layer from the top surfaces of the patterned mandrel layer and shoulder portions of the spacer layer, and removing the shoulder portions of the spacer layer, using a second fluorine containing etching gas.

Embodiments of the present disclosure further provide a method for forming a metal containing feature. The method includes performing a first etch process, the first etch process comprising removing portions of a spacer layer from top surfaces of a patterned mandrel layer, leaving only portions of the spacer layer on sidewalls of the patterned mandrel layer, using a first fluorine containing etching gas, performing a deposition process, the deposition process comprising conformally depositing an over layer on the top surfaces of the patterned mandrel layer and over the spacer layer on the sidewalls of the patterned mandrel layer, performing a second etch process, the second etch process comprising removing the over layer from the top surfaces of the patterned mandrel layer and shoulder portions of the spacer layer, and removing the shoulder portions of the spacer layer, using a second fluorine containing etching gas, and performing a third etch process, the third etch process comprising removing the patterned mandrel layer.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments described herein provide methods for forming semiconductor structures. More particularly, embodiments of the present disclosure provide methods for patterning a spacer layer having a desired top profile, such as a flat top profile. Such patterned spacer layers provide reduced inconsistencies and asymmetries, and thus when the patterned spacer layer is used as a hard mask to transfer the pattern to an active layer underneath, uniformity of the pitch is increased in fabricated structures. The methods provided herein include depositing an over layer on a spacer layer disposed on sidewalls of a patterned mandrel layer and on the patterned mandrel layer, and subsequently selectively removing the over layer from top surfaces of the patterned mandrel layer and shoulder portions of the spacer layer. This process allows etching the shoulder portions of the spacer layer to modify top profiles of the spacer layer, for example, to a flap top profile.

Figure 1:
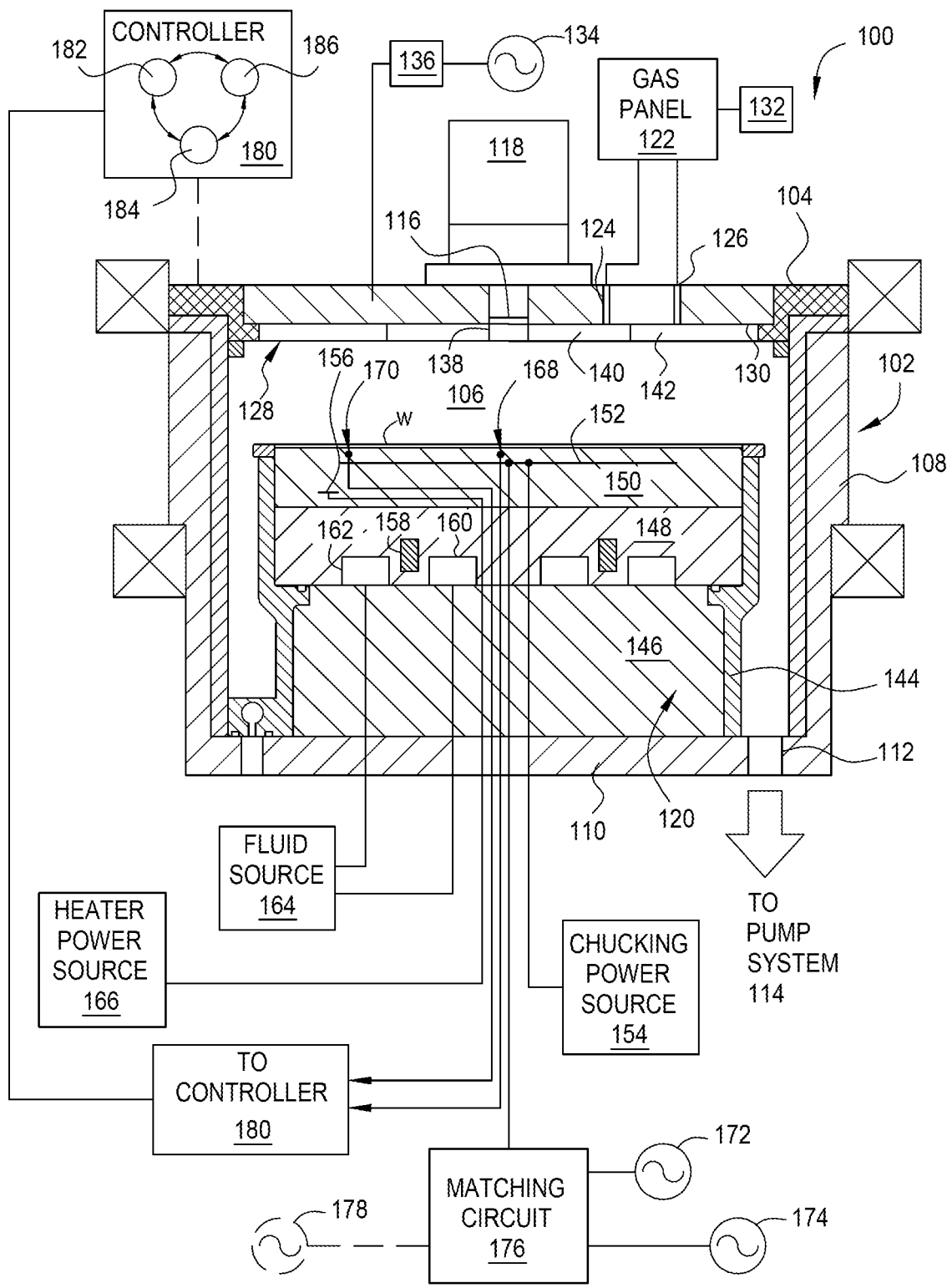
FIG. 1 depicts an inductively coupled plasma (ICP) etch chamber that may be utilized to perform a patterning process according to one embodiment.

FIG. 1 is a sectional view of one example of an inductively coupled plasma (ICP) etch chamber 100 suitable for performing an etching process. Suitable ICP etch chambers that may be adapted for use with the methods disclosed herein include inductively coupled plasma reactive ion etching (ICP-RIE) chambers, for example, a CENTRIS® SYM3™ etch chamber available from Applied Materials, Inc. of Santa Clara, California Although the ICP etch chamber 100 is shown including a plurality of features that enable superior etching performance, it is contemplated that other ICP etch chambers may be adapted to benefit from one or more of the inventive features disclosed herein.

The ICP etch chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and selectively sealed by a slit valve to facilitate entry and egress of a substrate W from the ICP etch chamber 100. An exhaust port 112 is defined in the chamber body 102 and couples the interior volume 106 to a vacuum pump system 114. The vacuum pump system 114 generally includes one or more pumps and throttle valves utilized to evacuate and regulate the pressure of the interior volume 106 of the ICP etch chamber 100.

The lid 104 is sealingly supported on the sidewall 108 of the chamber body 102. The lid 104 may be opened to allow access to the interior volume 106 of the ICP etch chamber 100. The lid 104 includes a window 116 that facilitates optical process monitoring. In one implementation, the window 116 is comprised of quartz or other suitable material that is transmissive to a signal utilized by an optical monitoring system 118 mounted outside the ICP etch chamber 100.

The optical monitoring system 118 is positioned to view at least one of the interior volume 106 of the chamber body 102 and/or the substrate W positioned on a substrate support pedestal assembly 120 through the window 116. In one embodiment, the optical monitoring system 118 is coupled to the lid 104 and facilitates an integrated deposition process that uses optical metrology to provide information that enables process adjustment to compensate for incoming substrate pattern feature inconsistencies (such as thickness, and the like), and provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, California.

A gas panel 122 is coupled to the ICP etch chamber 100 to provide process and/or cleaning gases to the interior volume 106. In the example depicted in FIG. 1, inlet ports 124, 126 are provided in the lid 104 to allow gases to be delivered from the gas panel 122 to the interior volume 106 of the ICP etch chamber 100. In one implementation, the gas panel 122 is adapted to provide fluorinated process gas through the inlet ports 124, 126 and into the interior volume 106 of the ICP etch chamber 100.

A showerhead assembly 128 is coupled to an interior surface 130 of the lid 104. The showerhead assembly 128 includes a plurality of apertures that allow the gases to flow through the showerhead assembly 128 from the inlet ports 124, 126 into the interior volume 106 of the ICP etch chamber 100 in a predefined distribution across the surface of the substrate W being processed in the ICP etch chamber 100.

A remote plasma source 132 may be optionally coupled to the gas panel 122 to facilitate dissociating a gas mixture from a remote plasma prior to entering into the interior volume 106 for processing. An RF power source 134 is coupled through a matching network 136 to the showerhead assembly 128. The RF power source 134 typically is capable of producing up to about 3000 W at a tunable frequency in a range from about 50 kHz to about 200 MHz.

The showerhead assembly 128 additionally includes a region transmissive to an optical metrology signal. An optically transmissive region or passage 138 is suitable for allowing the optical monitoring system 118 to view the interior volume 106 and/or the substrate W positioned on the substrate support pedestal assembly 120. The passage 138 may be a material, an aperture or plurality of apertures formed or disposed in the showerhead assembly 128 that is substantially transmissive to the wavelengths of energy generated by, and reflected back to, the optical monitoring system 118.

In one implementation, the showerhead assembly 128 is configured with a plurality of zones that allow for separate control of gas flowing into the interior volume 106 of the ICP etch chamber 100. In the example illustrated in FIG. 1, the showerhead assembly 128 has an inner zone 140 and an outer zone 142 that are separately coupled to the gas panel 122 through separate inlet ports 124, 126.

The substrate support pedestal assembly 120 is disposed in the interior volume 106 of the ICP etch chamber 100 below the gas distribution (showerhead) assembly 128. The substrate support pedestal assembly 120 holds the substrate W during processing. The substrate support pedestal assembly 120 generally includes a plurality of lift pins (not shown) disposed therethrough that are configured to lift the substrate W from the substrate support pedestal assembly 120 and facilitate exchange of the substrate W with a robot (not shown) in a conventional manner. An inner liner 144 may closely circumscribe the periphery of the substrate support pedestal assembly 120.

In one implementation, the substrate support pedestal assembly 120 includes a mounting plate 146, a base 148 and an electrostatic chuck 150. The mounting plate 146 is coupled to the bottom 110 of the chamber body 102 and includes passages for routing utilities, such as fluids, power lines and sensor leads, among others, to the base 148 and the electrostatic chuck 150. The electrostatic chuck 150 includes at least one clamping electrode 152 for retaining the substrate W below showerhead assembly 128. The electrostatic chuck 150 is driven by a chucking power source 154 to develop an electrostatic force that holds the substrate W to the chuck surface, as is conventionally known. Alternatively, the substrate W may be retained to the substrate support pedestal assembly 120 by clamping, vacuum or gravity.

At least one of the base 148 or electrostatic chuck 150 may include at least one optional embedded heater 156, at least one optional embedded isolator 158, and a plurality of conduits 160, 162 to control the lateral temperature profile of the substrate support pedestal assembly 120. The conduits 160, 162 are fluidly coupled to a fluid source 164 that circulates a temperature regulating fluid therethrough. The heater 156 is regulated by a power source 166. The conduits 160, 162 and heater 156 are utilized to control the temperature of the base 148, thereby heating and/or cooling the electrostatic chuck 150 and ultimately, the temperature profile of the substrate W disposed thereon. The temperature of the electrostatic chuck 150 and the base 148 may be monitored using a plurality of temperature sensors 168, 170. The electrostatic chuck 150 may further have a plurality of gas passages (not shown), such as grooves, that are formed in a substrate support pedestal supporting surface of the electrostatic chuck 150 and fluidly coupled to a source of a heat transfer (or backside) gas, such as helium (He). In operation, the backside gas is provided at controlled pressure into the gas passages to enhance the heat transfer between the electrostatic chuck 150 and the substrate W.

In one implementation, the substrate support pedestal assembly 120 is configured as a cathode and includes the electrode 152 that is coupled to a plurality of RF bias power sources 172, 174. The RF bias power sources 172, 174 are coupled between the electrode 152 disposed in the substrate support pedestal assembly 120 and another electrode, such as the showerhead assembly 128 or ceiling (lid 104) of the chamber body 102. The RF bias power excites and sustains a plasma discharge formed from the gases disposed in the processing region of the chamber body 102.

In the example depicted in FIG. 1, the dual RF bias power sources 172, 174 are coupled to the electrode 152 disposed in the substrate support pedestal assembly 120 through a matching circuit 176. The signal generated by the RF bias power sources 172, 174 is delivered through the matching circuit 176 to the substrate support pedestal assembly 120 through a single feed to ionize the gas mixture provided in the ICP etch chamber 100, thereby providing ion energy necessary for performing a deposition or other plasma enhanced process. The RF bias power sources 172, 174 are generally capable of producing an RF signal having a frequency of from about 50 kHz to about 200 MHz and a power between about 0 Watts and about 5000 Watts. An additional bias power source 178 may be coupled to the electrode 152 to control the characteristics of the plasma.

In one mode of operation, the substrate W is disposed on the substrate support pedestal assembly 120 in the ICP etch chamber 100. A process gas and/or gas mixture is introduced into the chamber body 102 through the showerhead assembly 128 from the gas panel 122. The vacuum pump system 114 maintains the pressure inside the chamber body 102 while removing deposition by-products.

A controller 180 is coupled to the ICP etch chamber 100 to control operation of the ICP etch chamber 100. The controller 180 includes a central processing unit (CPU) 182, a memory 184, and a support circuit 186 utilized to control the process sequence and regulate the gas flows from the gas panel 122. The CPU 182 may be any form of general purpose computer processor that may be used in an industrial setting. The software routines can be stored in the memory 184, such as random access memory, read only memory, floppy, or hard disk drive, or other form of digital storage. The support circuit 256 is conventionally coupled to the CPU 182 and may include cache, clock circuits, input/output systems, power supplies, and the like. Bi-directional communications between the controller 180 and the various components of the ICP etch chamber 100 are handled through numerous signal cables.

Figure 2:
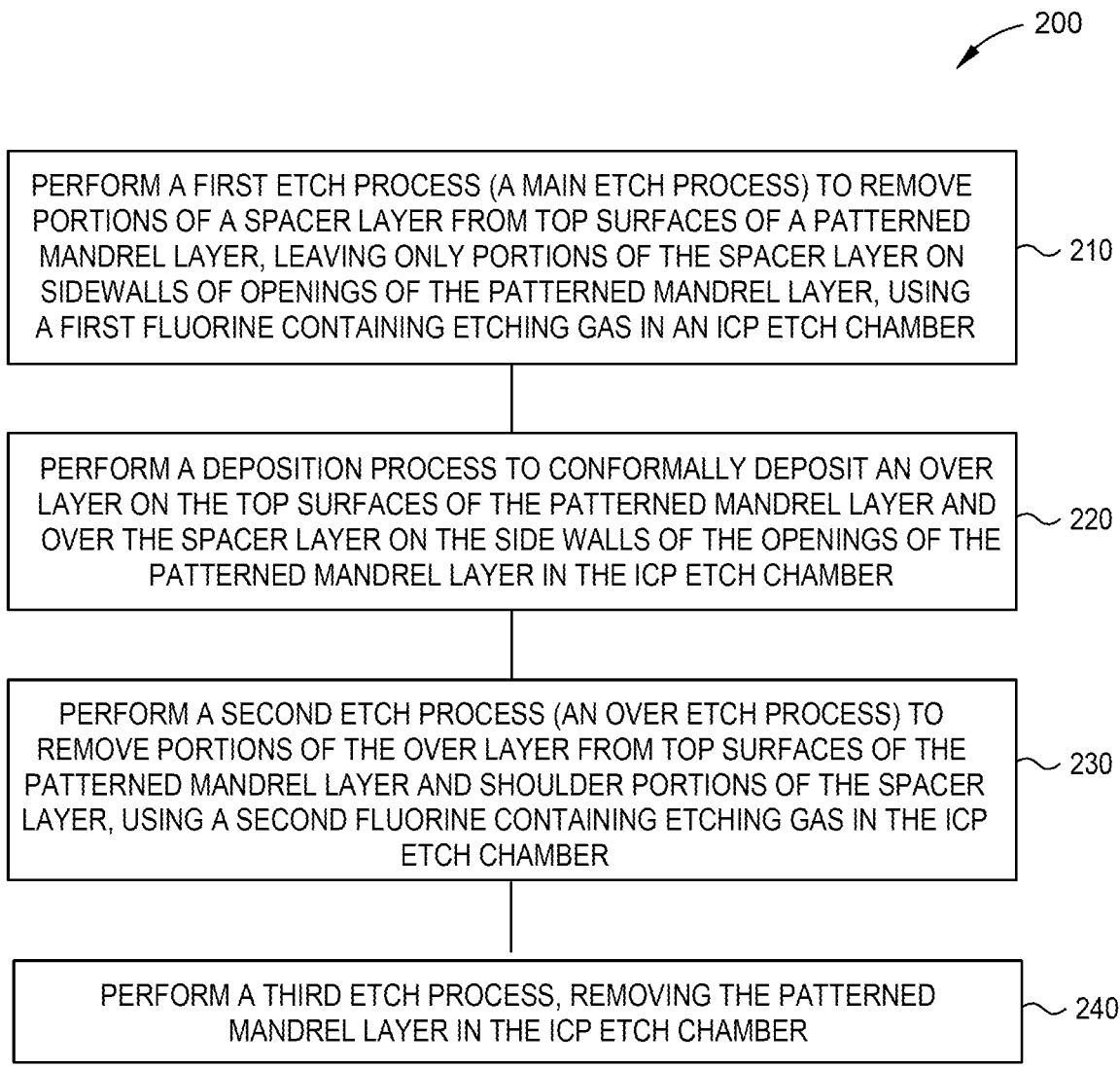
FIG. 2 illustrates a flowchart of a method of forming a nanostructure according to one embodiment.

FIG. 2 is a flow diagram of a method 200 for forming a nanostructure 300 according to one embodiment. FIGS. 3A, 3B, 3C, 3D, and 3E are cross-sectional views of a portion of the nanostructure 300 corresponding to various stages of the method 200. The method 200 may be utilized to form features in a material layer, such as a contact dielectric layer, a gate electrode layer, a gate dielectric layer, a STI insulating layer, inter-metal layer (IML), or any suitable layers.

Figure 3A:
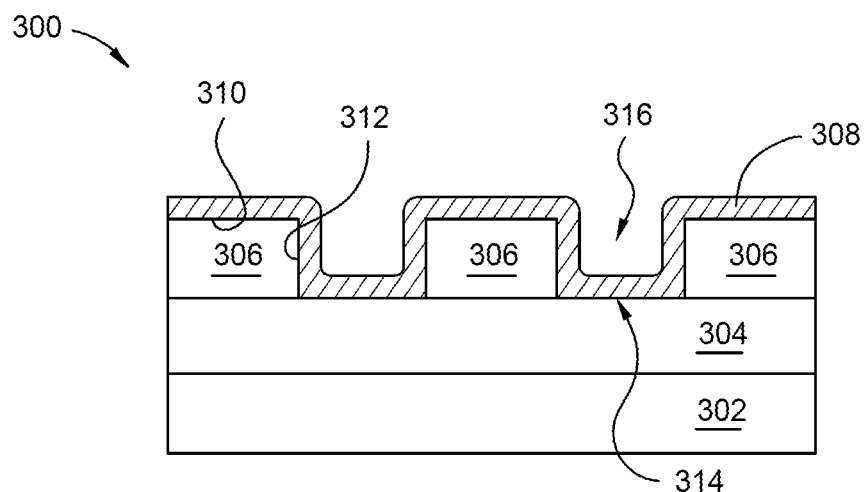
FIGS. 3A, 3B, 3C, 3D, and 3E are cross-sectional views of a portion of a nanostructure according to one embodiment.

As shown in FIG. 3A, the nanostructure 300 includes a substrate 302, an interfacial layer 304 disposed on the substrate 302, a patterned mandrel layer 306 disposed on the interfacial layer 304, and a spacer layer 308 disposed on top surfaces 310 and sidewalls 312 of the patterned mandrel layer 306 and bottom surfaces 314 of openings 316 within the patterned mandrel layer 306.

The substrate 302 may include material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 302 may have various dimensions, such as 200 mm, 300 mm, 450 mm or other diameter wafers, as well as, rectangular or square panels.

The interfacial layer 304 may be formed of silicon oxide ($SiO_2$), tetra-ethyl-orthosilicate (TEOS), silicon oxynitride (SiON), silicon boride ($SiB_x$), silicon carbonitride (SiCN), boron carbide (BC), amorphous carbon, boron nitride (BN), boron carbon nitride (BCN), carbon doped oxides, porous silicon dioxide, silicon nitride (SiN), oxycarbonitrides, polymers, phosphosilicate glass, fluorosilicate (SiOF) glass, organosilicate glass (SiOCH), other suitable oxide material, other suitable carbide material, other suitable oxycarbide material, or other suitable oxynitride material.

The mandrel layer 306 may be formed of carbon containing material, such as amorphous carbon, spin-on carbon (SoC), or other suitable carbon containing material, and patterned with the openings 316 by using any appropriate a lithography-and-etch process. In some embodiments, the patterned mandrel layer 306 has a line critical dimension (CD) of about 20 nm and about 50 nm, for example, about 35 nm. In one particular example, the mandrel layer 306 is formed of Saphira™ Advanced Patterning Film (APF) carbon hardmask produced by Applied Materials, Inc., located in Santa Clara, Calif.

The spacer layer 308 may be formed of silicon containing dielectric material, such as silicon nitride ($Si_3N_4$). In some other embodiments, the spacer layer 308 may be formed of doped silicon containing material, such as boron doped silicon material, phosphorus doped silicon, or other suitable group III, group IV or group V doped silicon material. In some embodiments, the spacer layer 308 has a thickness of between about 6 nm and about 20 nm. The spacer layer 308 may be formed using any appropriate deposition process, such as atomic layer deposition (ALD), chemical vapor deposition (CVD), spin-on, physical vapor deposition (PVD), or the like.

Figure 3B:
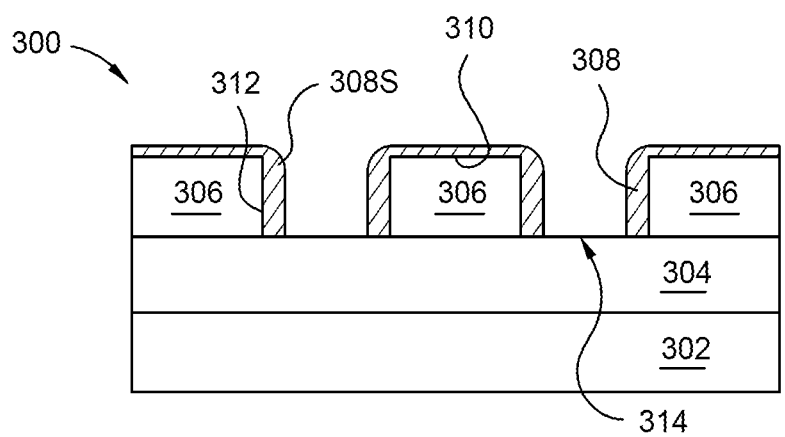

The method 200 begins in block 210 by a first etch process (also referred to as a "main etch" process) to partially remove portions of the spacer layer 308 from the top surfaces 310 of the patterned mandrel layer 306, leaving portions of the spacer layer 308 on the sidewalls 312 of the patterned mandrel layer 306, as shown in FIG. 3B. Portions of the spacer layer 308 on the bottom surfaces 314 of the openings 316 of the patterned mandrel layer 306 are also removed during the first etch process.

The main etch process in block 210 is performed by supplying a first fluorine containing etching gas that removes the spacer layer 308 selectively from the mandrel layer 306 in an ICP etch chamber, such as the ICP etch chamber 100. The portions of the spacer layer 308 on the patterned mandrel layer 306 are bombarded with plasma effluents generated from the first fluorine containing etching gas and directed towards the top surfaces 310 of the patterned mandrel layer 306. Due to the directionality of the plasma effluents, portions of the spacer layer 308 on sidewalls of the patterned mandrel layer 306 remain unetched. In the main etch process in block 210, an oxygen containing gas and inert gas are simultaneously supplied with the first fluorine containing etching gas. Suitable examples of the first fluorine containing etching gas include fluoroform ($CHF_3$). Suitable examples of the oxygen containing gas include $O_2$, $NO_2$, $N_2O$, $O_3$, $SO_2$, COS, CO, and $CO_2$. Suitable examples of the inert gas include argon (Ar), helium (He), nitrogen ($N_2$), or hydrogen ($H_2$).

In some embodiments, the spacer layer 308, after the main etch process, exhibits tapered or rounded profiles in shoulder portions 308S of the spacer layer 308 due to etching mainly by ion bombardment. The top profiles of the spacer layer 308 are modified, for example, to a flat top profile, in the following processes in blocks 220 and 230.

Figure 3C:
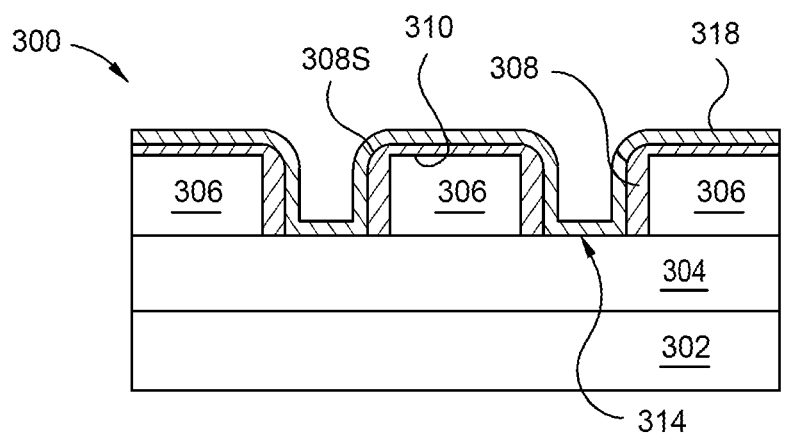

In block 220, a deposition process is performed to conformally deposit an over layer 318 over the spacer layer 308 remaining on the top surfaces 310 of the patterned mandrel layer 306 and on the sidewalls 312 of the patterned mandrel layer 306, as shown in FIG. 3C. The spacer layer 308 on the top surfaces 310 of the mandrel layer 306 protects the mandrel layer 306 from the deposition process in block 220. The over layer 318 is also deposited on the bottom surfaces 314 of the openings 316 of the patterned mandrel layer 306 during the deposition process. The over layer 318 may be formed of material that can be selectively etched over the patterned mandrel layer 306 in the etch process in block 230, such as silicon oxide ($SiO_2$), tetra-ethyl-orthosilicate (TEOS), silicon oxynitride (SiON), silicon boride (SiBx), silicon carbonitride (SiCN), boron carbide (BC), amorphous carbon, boron nitride (BN), boron carbon nitride (BCN), carbon doped oxides, porous silicon dioxide, silicon nitride (SiN), oxycarbonitrides, polymers, phosphosilicate glass, fluorosilicate (SiOF) glass, organosilicate glass (SiOCH), other suitable oxide material, other suitable carbide material, other suitable oxycarbide material, or other suitable oxynitride material. In some embodiments, the over layer 318 has a thickness of between about 1 nm and about 3 nm. The over layer 318 may be formed using any appropriate deposition process, such as atomic layer deposition (ALD), chemical vapor deposition (CVD), spin-on, physical vapor deposition (PVD), or the like. The deposition process in block 220 may be performed in an ICP etch chamber, such as the ICP etch chamber 100.

Figure 3D:
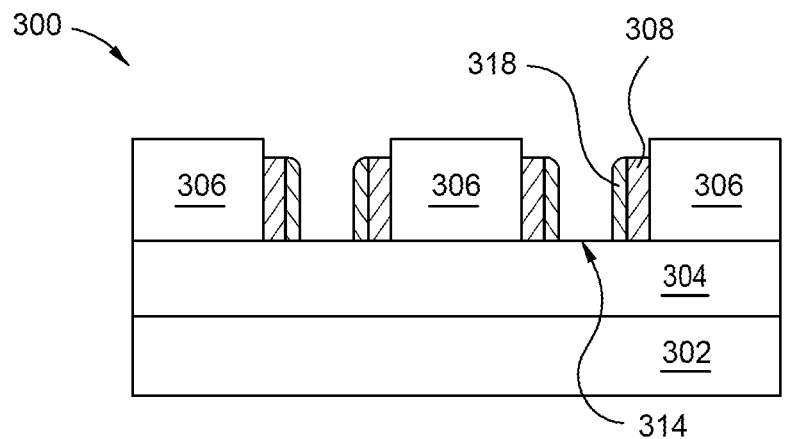

In block 230, a second etch process (also referred to as an "over etch" process) is performed to remove portions of the over layer 318 from the top surfaces 310 of the patterned mandrel layer 306 and the shoulder portions 308S of the spacer layer 308, and subsequently to remove the shoulder portions 308S of the spacer layer 308, as shown in FIG. 3D. The over etch process in block 230 is performed by supplying a second fluorine containing etching gas that removes the over layer 318 and the spacer layer 308 selectively to the mandrel layer 306 in an ICP etch chamber, such as the ICP etch chamber 100. The portions of the over layer 318 on the patterned mandrel layer 306 and the shoulder portions 308S of the spacer layer 308 are bombarded with plasma effluents 320 generated from the second fluorine containing etching gas and directed towards the top surfaces 310 of the patterned mandrel layer 306. Due to the directionality of the plasma effluents 320, portions of the over layer 318 on sidewalls of the spacer layer 308 remain un-etched. Due to the etch selectivity of the second fluorine containing etching gas, the mandrel layer 306 is etched at a slower etch rate than the spacer layer 306 on the sidewalls of the patterned mandrel layer 306. The shoulder portions 308S of the spacer layer 308 are further etched such that the spacer layer 308 has a flat top profile. A top profile of the spacer layer 308 after the over etch process in block 230 can be modified by adjusting the RF source power 134 and the RF bias power supplied to a remote plasma source, such as the remote plasma source 132 of the ICP etch chamber 100.

In the over etch process in block 230, an oxygen containing gas and inert gas are simultaneously supplied with the second fluorine containing etching gas. Suitable examples of the second fluorine containing etching gas include fluoromethane ($CH_3F$). Suitable examples of the oxygen containing gas include $O_2$, $NO_2$, $N_2O$, $O_3$, $SO_2$, COS, CO, and $CO_2$. Suitable examples of the inert gas include helium (He), nitrogen ($N_2$), argon (Ar), and hydrogen ($H_2$).

Figure 3E:
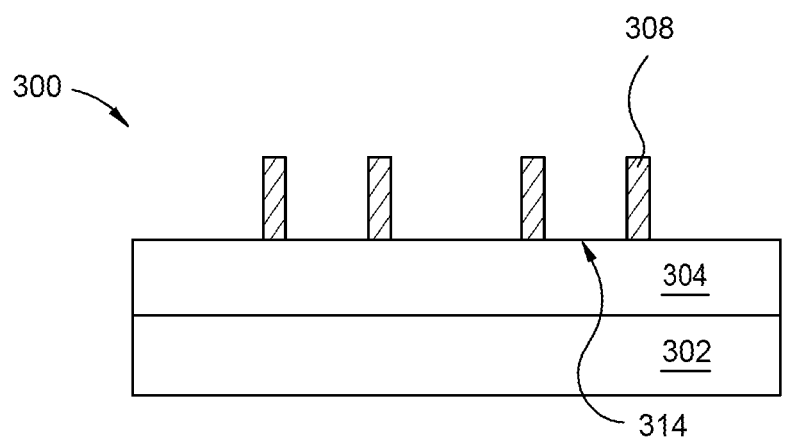

In block 240, a third etch process is performed to remove the mandrel layer 306 as shown in FIG. 3E, by a dry plasma etch process in an ICP etch chamber, such as the ICP etch chamber 100. The remaining over layer 318 on sidewalls of the spacer layer 308 is also removed during the third etch process.

The dry plasma etch process in block 240 is performed by simultaneously supplying an oxygen containing gas, and inert gas, such as argon (Ar), nitrogen ($N_2$), helium (He), or hydrogen ($H_2$), in the processing chamber. Suitable examples of the oxygen containing gas include $O_2$, $NO_2$, $N_2O$, $O_3$, $SO_2$, COS, CO, and $CO_2$. After the third etch process in block 240, the spacer layer 308 is patterned having a desired top profile, such as a flat top profile.

In some embodiments, the first etch process (main etch process) in block 210, the deposition process in block 220, the second etch process (over etch process) in block 230, and the third etch process in block 240 are performed in the same ICP etch chamber as a sequence without vacuum break.

In the embodiments described herein, methods for patterning a space layer having a desired top profile, such as a flat top profile are described. The methods include depositing an over layer on a spacer layer disposed on sidewalls of a patterned mandrel layer and on the patterned mandrel layer, and subsequently selectively removing the over layer from top surfaces of the patterned mandrel layer and shoulder portions of the spacer layer. This process allows etching the shoulder portions of the spacer layer to modify top profiles of the spacer layer. A patterned spacer layer having a flat top profile provides reduced inconsistencies and asymmetries, and thus when the patterned spacer layer is used as a hard mask to transfer the pattern to an active layer underneath, uniformity of the pitch is increased in fabricated structures.

While the foregoing is directed to embodiments of the present disclosure, other and further embodiments of the disclosure may be devised without departing from the basic scope thereof, and the scope thereof is determined by the claims that follow.

What is claimed is:

1. A method for forming a spacer layer having a flat top profile, the method comprising:
   performing a deposition process, the deposition process comprising conformally depositing an over layer on top surfaces of a patterned mandrel layer and over a spacer layer on sidewalls of the patterned mandrel layer;
   performing an etch process, using a fluorine containing etching gas, the etch process comprising:
      removing the over layer from the top surfaces of the patterned mandrel layer and shoulder portions of the over layer, and removing shoulder portions of the spacer layer; and simultaneously removing the patterned mandrel layer and the remaining over layer.

2. The method of claim 1, wherein the deposition process and the etch process are performed in an inductively coupled plasma (ICP) etch chamber without vacuum break.

3. The method of claim 1, wherein the spacer layer comprises silicon nitride.

4. The method of claim 1, wherein the patterned mandrel layer comprises a carbon containing material.

5. The method of claim 1, wherein the over layer comprises silicon oxide.

6. The method of claim 1, wherein the fluorine containing etching gas comprises fluoromethane ($CH_3F$).

7. A method for forming a spacer layer having a flat top profile, the method comprising:
- performing a main etch process, using a first fluorine containing etching gas, the main etch process comprising:
  - removing portions of a spacer layer from top surfaces of a patterned mandrel layer, leaving only portions of the spacer layer on sidewalls of the patterned mandrel layer;
- performing a deposition process, the deposition process comprising conformally depositing an over layer on the top surfaces of the patterned mandrel layer and over the spacer layer on the sidewalls of the patterned mandrel layer;
- performing an over etch process, using a second fluorine containing etching gas, the over etch process comprising:
  - removing the over layer from the top surfaces of the patterned mandrel layer and shoulder portions of the over layer, and
  - removing shoulder portions of the spacer layer; and
- simultaneously removing the patterned mandrel layer and the remaining over layer.

8. The method of claim 7, wherein the main etch process, the deposition process, and the over etch process are performed in an inductively coupled plasma (ICP) etch chamber without vacuum break.

9. The method of claim 7, wherein the spacer layer comprises silicon nitride.

10. The method of claim 7, wherein the patterned mandrel layer comprises a carbon containing material.

11. The method of claim 7, wherein the over layer comprises silicon oxide.

12. The method of claim 7, wherein the first fluorine containing etching gas comprises fluoroform ($CHF^3$).

13. The method of claim 7, wherein the second fluorine containing etching gas comprises fluoromethane ($CH_3F$).

14. A method for forming a spacer layer having a flat top profile, the method comprising:
- performing a first etch process, the first etch process comprising removing portions of a spacer layer from top surfaces of a patterned mandrel layer, leaving only portions of the spacer layer on sidewalls of the patterned mandrel layer, using a first fluorine containing etching gas;
- performing a deposition process, the deposition process comprising conformally depositing an over layer on the top surfaces of the patterned mandrel layer and over the spacer layer on the sidewalls of the patterned mandrel layer;
- performing a second etch process, the second etch process comprising removing the over layer from the top surfaces of the patterned mandrel layer and shoulder portions of the over layer, and removing shoulder portions of the spacer layer, using a second fluorine containing etching gas; and
- performing a third etch process, the third etch process comprising removing the patterned mandrel layer and the remaining over layer.

15. The method of claim 14, wherein the first etch process, the deposition process, the second etch process, and the third etch process are performed in an inductively coupled plasma (ICP) etch chamber without vacuum break.

16. The method of claim 14, wherein the spacer layer comprises silicon nitride.

17. The method of claim 14, wherein the patterned mandrel layer comprises a carbon containing material.

18. The method of claim 14, wherein the over layer comprises silicon oxide.

19. The method of claim 14, wherein the first fluorine containing etching gas comprises fluoroform ($CHF_3$).

20. The method of claim 14, wherein the second fluorine containing etching gas comprises fluoromethane ($CH_3F$).

* * * * *